United States Patent [19]

Schroeder

[11] 4,041,390

[45] Aug. 9, 1977

[54] TRANSCEIVER SQUELCH CIRCUIT

[75] Inventor: Daniel Ray Schroeder, Lombard, Ill.

[73] Assignee: Motorola, Inc., Schaumburg, Ill.

[21] Appl. No.: 670,216

[22] Filed: Mar. 25, 1976

[51] Int. Cl.² ............................................. H04B 1/44
[52] U.S. Cl. ....................................... 325/21; 325/403; 325/478
[58] Field of Search ................... 325/21, 22, 400, 402, 325/403, 405, 408, 411, 319, 456, 478, 17, 18; 343/178, 180

[56] References Cited

U.S. PATENT DOCUMENTS

| | | | |
|---|---|---|---|
| 3,569,840 | 3/1971 | Tanaka | 325/478 |
| 3,654,555 | 4/1972 | Ryan et al. | 325/478 |
| 3,873,926 | 3/1975 | Wright | 325/478 |

Primary Examiner—Robert L. Griffin
Assistant Examiner—Jin F. Ng
Attorney, Agent, or Firm—James W. Gillman; Victor Myer; James P. Hamley

[57] ABSTRACT

A radio transceiver includes means to switch from the transmit to the receive mode. The disclosed squelch circuit operates in the receive mode to mute and unmute the receiver at different received signal levels to prevent undesirable muting during signal fading conditions. The squelch also provides a means to mute the receiver for a sufficient period allowing switching transients to die out after the transceiver has been switched from the transmit to the receive mode.

8 Claims, 1 Drawing Figure

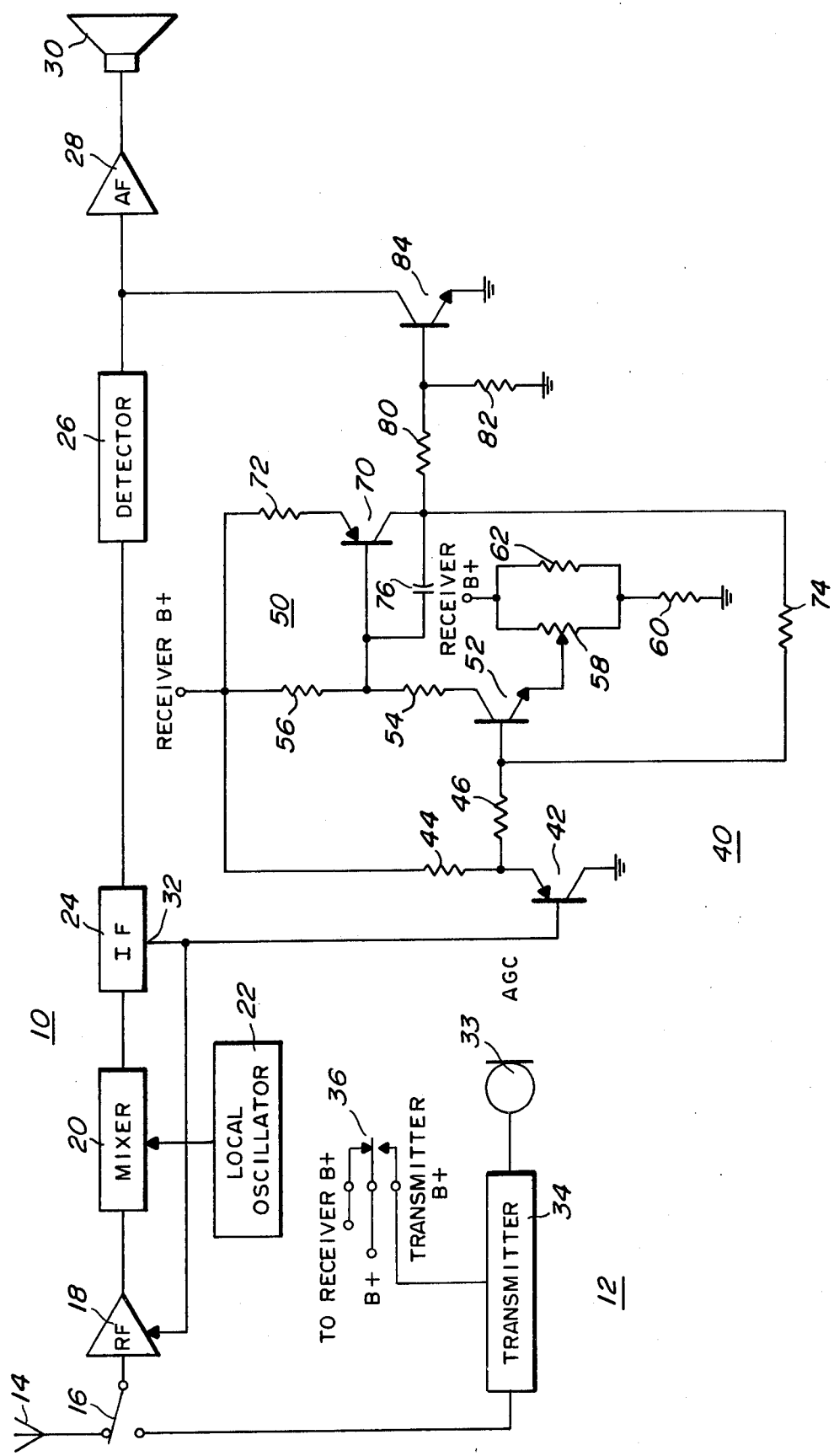

TRANSCEIVER SQUELCH CIRCUIT

BACKGROUND OF THE INVENTION

The present invention pertains to the radio communication art and, more particularly, to a squelch circuit adapted for use in a radio transceiver.

Squelch circuits for use in radio receivers are well known in the communication art. Squelch circuit operation includes monitoring the level of the signal received and processed by the receiver and muting of the receiver if this signal does not exceed a certain minimum threshold level. As a result of squelch action, the user of the receiver is not subjected to annoying noise signals which occur in the absence of a received information signal. Squelch circuits are commonly found in amplitude modulated type receivers and are especially suited for use in two-way amplitude modulated transceivers.

A substantial problem with squelch circuits used in prior amplitude modulated receivers is that the squelch often operates on signal fading. That is, an otherwise strong received signal might sometimes fade in level due to an interference in the transmitting medium. If the threshold level for squelch action is set at the same level in both the receiver mute and unmute conditions, the receiver is subject to muting during the fade periods whereby communication to the listener is hampered.

In addition, prior art squelch circuits have not adequately provided for switching transients which occur when an amplitude modulated transceiver is switched from the transmit to the receive mode. During, and after, the switching transition, circuitry within the receiver may produce transient signals which, if not muted, result in an annoyance to the listener.

SUMMARY OF THE INVENTION

It is an object of this invention, therefore, to provide a squelch circuit which mutes and unmutes the receiver at two distinct received signal levels.

It is a further object of this invention to provide the above described squelch circuit for use in a radio transceiver wherein the squelch circuit includes means for muting the receiver for a predetermined period after the transceiver has been switched from the transmit to the receive mode.

Briefly, according to the invention, the squelch circuit is adapted for use in the receiver portion of a transceiver. The transceiver has a switch for selecting either the transmit or the receive mode of operation. The receiver portion includes a means for providing an automatic gain control (AGC) signal. The squelch circuit includes a hysteresis means which unmutes the receiver at a first AGC threshold level and mutes the receiver at a second AGC threshold level. Also included in the squelch circuit is a delaying means which responds to the transceiver switch to mute the receiver for a predetermined period of time after the transceiver has been switched from the transmit to the receive mode.

BRIEF DESCRIPTION OF THE DRAWING

The sole FIGURE illustrates, in schematic diagram form, the improved squelch circuit used in combination with a radio frequency transceiver.

DETAILED DESCRIPTION OF THE PREFERRED EMBODIMENT OF THE INVENTION

Referring to the drawing, illustrated is a transceiver including a receiver portion 10 and a transmitter portion 12. The receiver 10 and transmitter 12 are selectively coupled to an antenna 14 via an antenna switch 16.

The receiver 10 is of the amplitude modulated type having a radio frequency amplifier stage 18 at its input. The radio frequency amplifier stage 18 includes selectivity circuitry for turning the receiver 10 to a desired station or channel. The output from the radio frequency amplifier 18 feeds to a mixer stage 20. Also coupled to the mixer 20 is a local oscillator 22. The mixer 20 operates in the known manner to convert the received signal from the radio frequency amplifier 18 to an intermediate frequency. The resulting intermediate frequency signal is passed to an intermediate frequency filter and amplifier stage 24. Intermediate frequency filter and amplifier stage 24 provides filtering and amplification at the intermediate frequency thereby rejecting undesired signals. The resulting filtered intermediate frequency signal passes to a conventional amplitude modulated detector stage 26 which recovers the audio signal from the received radio frequency signal. This audio signal is amplified in an audio frequency amplifier 28 and transduced to audibility in a speaker 30.

The intermediate frequency filter and amplifier stage 24 includes circuitry for providing an automatic gain control (AGC) output signal, at AGC output terminal 32. This AGC signal is of a level representative of the level of the signal received and processed by the receiver 10. In this particular embodiment of the invention, the AGC signal produced at the IF stage output terminal 32 is inversely proportional to the received radio frequency level. That is, the AGC produced signal decreases corresponding to increases in the received radio frequency signal.

The AGC voltage at AGC terminal 32 of IF stage 24 feeds back to a gain control input of the radio frequency amplifier 18 for controlling the gain thereof. Such AGC feedback is known in the art, and is utilized for the purpose of maintaining the RF stage 18 and subsequent stages in the linear mode of operation.

The transmitter portion 12 includes a microphone 33 which, in the known manner, feeds to a transmitter 34. The transmitter produces an amplitude modulated radio frequency signal which may be transmitted over the antenna 14. Associated with the microphone 33 is a push-to-talk switch 36 which operates to apply a DC bias B+ to either the receiver 10 or the transmitter 34 dependent on the switch 36 position.

Shown coupled to the receiver portion 10 is the improved squelch circuit 40. The input to the squelch circuit 40 is a PNP transistor 42 operated as an emitter follower. Feeding into the base of transistor 42 is the AGC signal from the intermediate frequency filter and amplifier 24. Changes in the AGC signal level cause a corresponding change at the emitter of the transistor stage 42. The emitter of transistor 42 couples to the receiver B+ output from the switch 36 through a load resistor 44. This emitter also couples to a coupling resistor 46 to the input of the hysteresis circuit 50. The input of the hysteresis circuit 50 is at the base of a NPN transistor 52 which has collector load resistors 54 and 56 series connecting to the receiver B+ from the switch 36. The emitter of transistor 52 couples to the tap of a potentiometer 58 which connects at either end to the receiver DC potential B+, and through a resistor 60 to ground potential. In shunt across the resistance of the potentiometer 58 is a shunt resistor 62, chosen to determine the range of resistance of the potentiometer 58.

The output from the common connection of collector load resistors 54, 56 feeds to the base of a PNP transistor 70. Transistor 70 has an emitter resistor 72 coupling to the receiver B+ output from the switch 36, and a feedback collector load resistor 74 whose remaining end connects to the base of the hysteresis transistor 52. Coupling from the base to the collector of the PNP transistor 70 is a delay capacitor 76. The output from the PNP transistor 70 is voltage divided via a pair of resistors 80, 82 and applied to the base of an output buffer transistor 84. Buffer transistor 84 is of the NPN type, having its emitter connected to ground potential and its collector connected to the output of the detector stage 26.

Operation of the squelch circuit 40 may be understood as follows. The voltage at the base of the emitter of transistor 42 is inversely proportional to the strength of the received RF signal. To turn on transistor 52 this voltage must exceed a threshold voltage determined by the base-to-emitter on voltage of transistor 52 along with the setting of the potentiometer 58. For a strong RF received signal the voltage at the base of transistor 52 is below this threshold voltage thus rendering transistor 52 nonconductive. With transistor 52 nonconductive the base of transistor 70 is at receiver B+ thus rendering transistor 70 nonconductive, thereby biasing buffer transistor 84 to a nonconductive state. With transistor 84 nonconductive the detector 26 output signal feeds into the audio frequency amplifier 28 and speaker 30, hence the receiver is unmuted. As the received RF signal decreases the AGC signal inversely increases whereby the threshold voltage at the base of transistor 52 is exceeded. This drives transistor 52 to saturation which in turn drives transistor 70 to saturation. With transistor 70 in saturation the buffer stage 84 is biased to a conductive state whereby the output from detector 26 is shunted from the audio frequency amplifier 28 and the receiver is muted.

With the squelch circuit 40 in the mute mode the high voltage at the collector transistor 70 is fed back via feedback resistor 74 to the base of transistor 52. The increased voltge at the base of transistor 52 means that the AGC voltage must drop lower, and thus the RF signal level rise higher, than was needed to activate the squelch circuit 40 to the mute state. Thus, the squelch circuit has a hysteresis, the degree of which is controlled by the value of resistor 74 and resistor 46. The effect of the hysteresis is such that when the receiver is in the unmute condition the received signal may fade below the signal level required to cause a transition to the unmute condition before the receiver will mute. Thus the system will remain unmuted for the fading signal.

It should be noted that the threshold level required to drive the squelch circuit from the unmute to mute condition may be manually adjusted by setting the potentiometer 58. Also of note is that temperature compenstion is provided for varying ambient temperatures since the emitter base junction of transistor 42 tracks the emitter base turn-on voltage of transistor 52.

The squelch circuit 40 also operates to mute the receiver 10 for a predetermined period after push-to-talk switch 36 switches the transceiver from the transmit to receive mode. This may be understood as follows. With the push-to-talk switch 36 in the transmit mode the receiver B+ potential is zero and the delay capacitor 76 discharges. Upon switching the push-to-talk switch 36 to the receive mode the receiver B+ goes high, pulling the emitter of transistor 70 high. However, the delay capacitor 76 keeps the base of transistor 70 low momentarily, thus forward biasing transistor 70 to saturation and, via buffer stage 84, muting the receiver 10. This delay time muting may be predeterminedly controlled by selecting the values of the capacitor 76 and resistors 80 and 82 such that any transients which occur subsequent to transceiver switching from the transmit to receive mode die out prior to unmuting of the receiver 10. Thus, annoying transient signals which would otherwise be reproduced by the speaker 30 are muted.

In summary, an improved squelch circuit has been shown which is particularly suited for use in combination with a radio transceiver. The squelch includes a hysteresis response which allows fading of a received signal without muting the receiver. Also, the squelch provides a means to mute the receiver for a predetermined time period following switching of the transceiver from the transmit to the receive mode.

While a preferred embodiment of the invention has been described in detail, it should be understood that many modifications and variations thereto are possible, all of which fall within the true spirit and scope of the invention.

I claim:

1. A squelch circuit adapted for use in the receiver portion of a transceiver having a switching means to select either the transmit or receive mode, the receiver including a means for providing an automatic gain control (AGC) signal, the squelch circuit comprising:
   hysteresis means for unmuting the receiver at a first AGC threshold level and muting the receiver at a second AGC threshold level; and
   delaying means, responsive to the switching means, for muting the receiver for a predetermined period after the transceiver has been switched from the transmit to the receive mode.

2. The squelch circuit of claim 1 wherein the hysteresis means comprises a means for predeterminedly fixing the first and second predetermined AGC threshold levels such that the receiver is unmuted for receiver signals at a level higher than the receiver signal level required to mute the receiver.

3. The squelch circuit of claim 1 further comprising a means for temperature compensating the hysteresis means against changes in its response to the AGC signal as a result of ambient temperature changes.

4. The squelch circuit of claim 1 wherein the delaying means comprises means for setting the predetermined muting period to mute the receiver for the duration of switching transients occurring on transceiver switching from the transmit to the receive modes.

5. A radio transceiver comprising:
   a transmitter;
   a receiver for processing radio frequency signals, the receiver having automatic gain control circuitry for producing an AGC signal having a level representative of the level of the radio frequency signals processed by the receiver;
   switch means for switching the transceiver to either the transmit or receive mode; and
   squelch circuit means including hysteresis means for unmuting the receiver at a first AGC signal level and muting the receiver at a second AGC signal level, the first AGC signal level corresponding to a higher received signal level than the second AGC level, and delaying means, responsive to the switch means, for muting the receiver for a predetermined period after the transceiver has been switched from the transmit to the receive mode.

6. The radio transceiver of claim 5 further comprising a means for temperature compensating the hysteresis means against changes in its response to the AGC signal as a result of ambient temperature changes.

7. The radio transceiver of claim 5 wherein the delaying means comprises means for setting the predetermined muting period to mute the receiver for the duration of switching transients occurring on transceiver switching from the transmit to the receive modes.

8. The radio transceiver of claim 5 wherein the switch means is comprised of a push-to-talk switch on a microphone.

* * * * *